United States Patent
Lee et al.

(10) Patent No.: US 8,044,540 B2
(45) Date of Patent: Oct. 25, 2011

(54) SYSTEMS AND METHODS FOR A SPDT SWITCH OR SPMT SWITCH WITH TRANSFORMER

(75) Inventors: Dong Ho Lee, Atlanta, GA (US); Minsik Ahn, Atlanta, GA (US); Kyu Hwan An, Dunwoody, GA (US); Wangmyong Woo, Cumming, GA (US); Chang-Ho Lee, Marietta, GA (US); Joy Laskar, Marietta, GA (US)

(73) Assignees: Georgia Tech Research Corporation, Atlanta, GA (US); Samsung Electro-Mechanics, Gyunngi-Do (KR)

( * ) Notice: Subject to any disclaimer, the term of this patent is extended or adjusted under 35 U.S.C. 154(b) by 254 days.

(21) Appl. No.: 12/565,137

(22) Filed: Sep. 23, 2009

(65) Prior Publication Data
US 2011/0068636 A1    Mar. 24, 2011

(51) Int. Cl.
*H01H 31/10* (2006.01)
(52) U.S. Cl. .......... 307/115; 330/51; 330/188; 330/190; 330/195; 330/197; 333/101; 333/103; 333/105; 333/253; 333/262
(58) Field of Classification Search .................. 307/115; 330/51, 188, 190, 195, 197; 333/101
See application file for complete search history.

(56) References Cited

U.S. PATENT DOCUMENTS

| | | | | |
|---|---|---|---|---|
| 4,247,948 A * | 1/1981 | Okada et al. | ................... | 455/116 |
| 5,661,434 A | 8/1997 | Brozovich et al. | | |
| 6,801,114 B2 * | 10/2004 | Yang et al. | ................... | 336/200 |
| 7,348,841 B2 | 3/2008 | Kim et al. | | |
| 2008/0299914 A1 * | 12/2008 | Nakajima et al. | ................ | 455/83 |

* cited by examiner

*Primary Examiner* — Rexford Barnie
*Assistant Examiner* — Toan Vu
(74) *Attorney, Agent, or Firm* — Sutherland Asbill & Brennan LLP (57) ABSTRACT

A SPDT or SPMT switch may include a transformer having a primary winding and a secondary winding, where a first end of the secondary winding is connected to a single pole port, where a first end of the primary winding is connected to a first throw port; a first switch having a first end and a second end, where the first end is connected to ground; and a second switch, where a second end of the secondary winding is connected to both a second end of the first switch and a first end of the second switch, where a second end of the second switch is connected to a second throw port, where the first switch controls a first communication path between the single pole port and the first throw port, and where the second switch controls a second communication path between the second throw port and the single pole port.

20 Claims, 6 Drawing Sheets

SYSTEMS AND METHODS FOR A SPDT SWITCH OR SPMT SWITCH WITH TRANSFORMER

FIELD OF INVENTION

The invention relates generally to a single pole double throw (SPDT) switch or a single pole multi-throw (SPMT) switch, and more particularly, to systems and methods for a SPDT switch or SPMT switch with a transformer.

BACKGROUND OF THE INVENTION

Single pole double throw (SPDT) switches for mobile handsets are typically located between an antenna and a radio front-end. Generally, one switch is located between a transmitter block (TX) output and an antenna; the other is located between a receiver block (RX) input and an antenna. Both switches never close simultaneously to prevent a direct path from TX to RX. The switches are required to have small insertion loss for minimum power loss in transmit mode, and noise figure and large isolation for minimum leakage in receive mode. There exist trade-offs between small insertion loss and large isolation. The size of transistor for a switch should be large to achieve small insertion loss with a multiple parallel configuration, but a large transistor brings parallel large parasitic capacitance and prevents the achievement of large isolation.

High Electron Mobility Transistor (HEMT) technology is currently preferred for implementing a SPDT switch because of its best performance for switch operation due to high breakdown voltage and small parasitic capacitance. However, the technology is one of the most expensive technologies. Moreover, some applications require high power handling capability at the TX switch. In that case, series switches are cascaded to overcome high voltage swing from the high power but high insertion loss cannot be avoided.

BRIEF SUMMARY OF THE INVENTION

Systems and methods may provide a SPDT or SPMT switch with a transformer that may include multiple switches and a transformer. The transmitter block (TX) output network may be provided by the transformer. Two switches may be connected to the secondary winding of the transformer. A first of the two switches, which may operate as a TX switch, may be located between the secondary winding and ground. The voltage swing at the TX switch may be very small at the ON state because of very low impedance. Therefore, the TX switch can be implemented with a transistor which has a low breakdown voltage even though the SPDT or SPMT switch handles high power. Low insertion loss may also be achieved without the need of a cascaded switch structure.

According to an example embodiment of the invention, there is a SPDT (single pole double throw) or SPMT (single pole multi-throw) switch system. The system may include a transformer having a primary winding and a secondary winding, where the primary winding and the secondary winding each have respective first and second ends, where the first end of the secondary winding is connected to a single pole port, where the first end of the primary winding is connected to a first throw port; a first switch having a first end and a second end, where the first end is connected to ground; and a second switch having a first end and a second end, where the second end of the secondary winding is connected to both the second end of the first switch and the first end of the second switch, where the second end of the second switch is connected to a second throw port, where the first switch controls, at least in part, a first communication path between the single pole port and the first throw port, and where the second switch controls, at least in part, a second communication path between the second throw port and the single pole port.

According to another example embodiment of the invention, there is another SPDT (single pole double throw) or SPMT (single pole multi-throw) switch system. The system may include a transformer having a primary winding and a secondary winding, where the primary winding and the secondary winding each have respective first and second ends, where the first end of the secondary winding is connected to a single pole port, where the first end of the primary winding is connected to a first differential port, where the second end of the primary winding is connected to a second differential port, where the first and second differential ports collectively form a first throw port; a first switch having a first end and a second end, wherein the first end is connected to ground; and a second switch having a first end and a second end, where the second end of the secondary winding is connected to both the second end of the first switch and the first end of the second switch, where the second end of the second switch is connected to a second throw port, where the first switch controls, at least in part, a first communication path between the single pole port and the first throw port, and where the second switch controls, at least in part, a second communication path between the second throw port and the single pole port.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF THE INVENTION

Embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Example embodiments of the invention may provide for a SPDT switch or SPMT switch with a transformer, which may be comprised of multiple switches and one or more transformers. The one or more transformers may be used for implementing a transmit block (TX) output network, according to an example embodiment of the invention. Two switches may be connected to the secondary winding of the transformer. The TX switch may be located between the secondary winding and ground. The voltage swing at the TX switch is very small in the ON state because of very low impedance. Thus, a single switch can be used for TX switch even at high power applications due to the small voltage swing between the secondary winding and ground. The RX path does not require high power handling capability; therefore, the RX switch does not have to be in a cascaded configuration. It will be appreciated that an SPDT switch or SPMT with a transformer may relax the specifications for the component switches for high power applications.

In accordance with an example embodiment of the invention, the component switches of the SPDT switch or SPMT switch may be implemented using a variety of semiconductor technologies, including MOSFETs with standard bulk CMOS technology that are known with very low breakdown voltage. In addition, an example SPDT switch can be integrated with CMOS power amplifiers and CMOS low noise amplifiers (LNAs) as a single chip, according to an example embodiment of the invention. An integrated MOSFET switch may be a cost effective solution for mobile applications, according to an example embodiment of the invention.

Figure 1A:
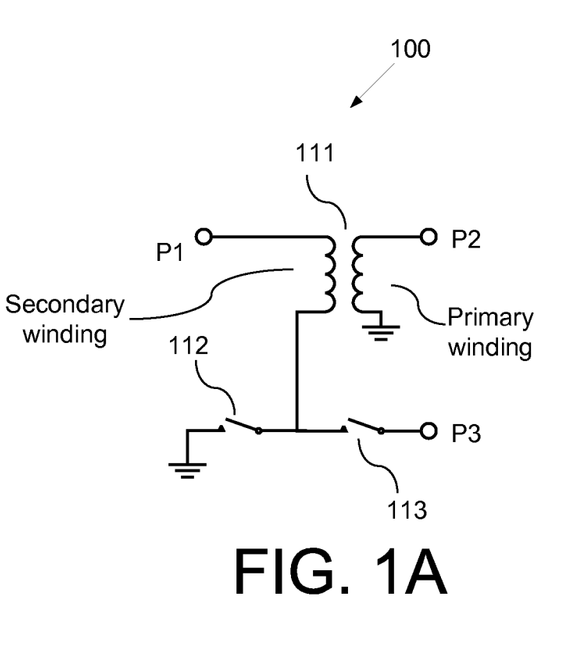
FIG. 1A illustrates a system for an example SPDT switch with a transformer in accordance with an example embodiment of the invention.

FIG. 1A illustrates a system 100 for an example SPDT switch with a transformer in accordance with an example embodiment of the invention. As shown in FIG. 1A, the system 100 may include a transformer 111 having a primary winding a secondary winding. An end of the secondary winding may be connected to a single pole port P1 while another end of the secondary winding may be connected to an end of switches 112 and 113. The other end of the switch 112 may be connected to ground, and the other end of the switch 113 may be connected to a double throw port P3. An end of the primary winding may be connected to a double throw port P2 while the other end of the primary winding may be connected to ground.

Still referring to FIG. 1A, the switch 112 may control the P2-to-P1 communications path, and the switch 113 may control the P1-to-P3 communications path. It will be appreciated that port P1 may be connected to an antenna, port P2 may be connected to an output of a transmitter block (TX), and port P3 may be connected to an input of a receiver block (RX), according to an example embodiment of the invention. Thus, the primary winding of the transformer 111 may be used as an output network for a power amplifier of the TX. The secondary winding of the transformer 111 may be used as an input network (e.g., a matching network) for a low noise amplifier (LNA) of the RX, according to an example embodiment of the invention.

Figure 1B:
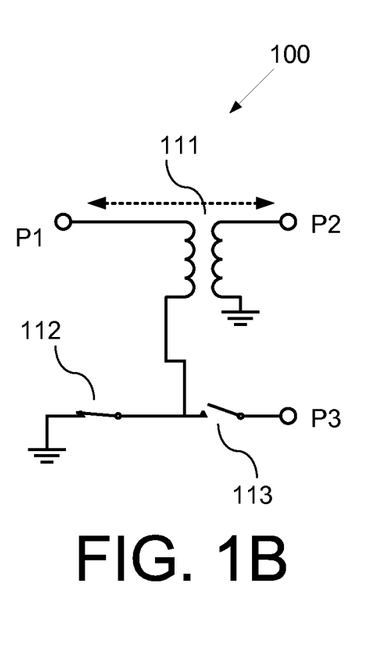
FIG. 1B illustrates the system for an example SPDT switch with a transformer when the P1-to-P2 communications path is ON, according to an example embodiment of the invention.

FIG. 1B illustrates the system 100 for an example SPDT switch with a transformer when the P1-to-P2 communications path is ON, according to an example embodiment of the invention. The P1-to-P2 communications path may be ON when a transmitter block (TX) connected to port P2 is enabled, according to an example embodiment of the invention. As shown in FIG. 1B, the system 100 may close the switch 112 to enable the P2-to-P1 communications path, and open the switch 113 to disable the P1-to-P3 communications path. As the switch 113 is opened, port P3 is isolated from port P1. The transformer 111 can then transfer signals between port P1 and port P2 when the switch 112 is closed, according to an example embodiment of the invention.

Figure 1C:
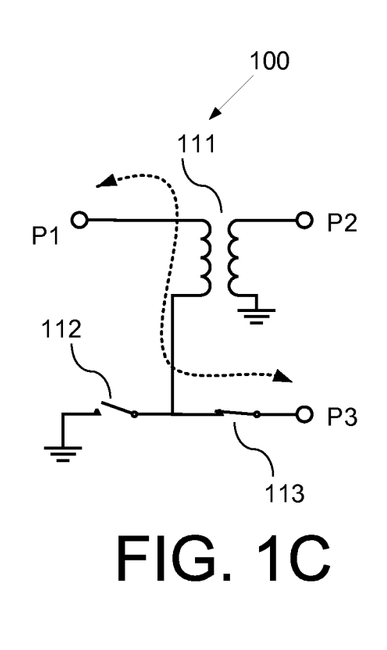
FIG. 1C illustrates a system for an example SPDT switch with a transformer when the P1-to-P3 communications path is ON, according to an example embodiment of the invention.

FIG. 1C illustrates a system 100 for an example SPDT switch with a transformer when the P1-to-P3 communications path is ON, according to an example embodiment of the invention. The P1-to-P3 path may be ON when a receiver block (RX) connected to port P3 is enabled, according to an example embodiment of the invention. As shown in FIG. 1C, the system 100 may open the switch 112 to disable the P2-to-P1 path, and close the switch 113 to enable the P1-to-P3 path. As the switch 112 is opened, the transformer 111 cannot transfer the signal between ports P1 and P2 due to the high impedance instead of ground at the secondary winding, and thus port P2 is isolated from port P1. The transformer 111 transfers signals between ports P1 and P3 when the switch 113 is closed, according to an example embodiment of the invention.

Figure 2:
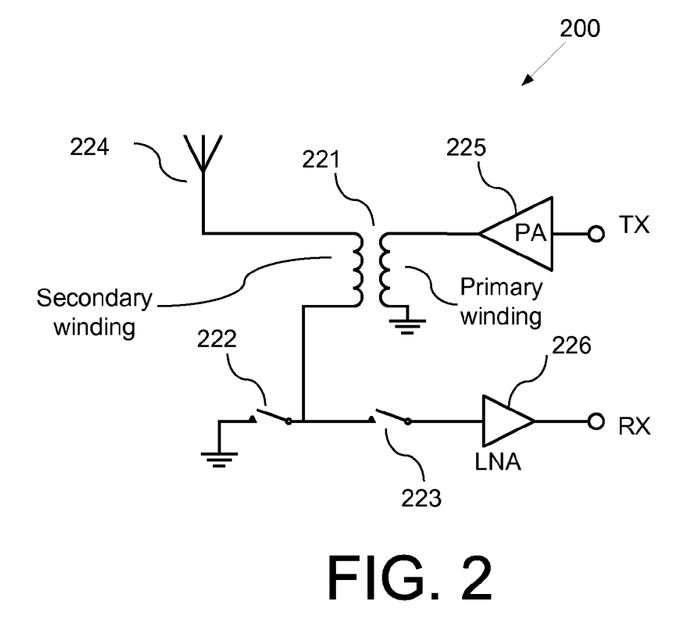
FIG. 2 illustrates a system for an example SPDT switch with a transformer, an antenna, a power amplifier (PA), and a low noise amplifier (LNA), according to an example embodiment of the invention.

FIG. 2 illustrates a system 200 for an example SPDT switch with a transformer, an antenna, a power amplifier (PA), and a low noise amplifier (LNA), according to an example embodiment of the invention. As shown in FIG. 2, the system 200 may include a transformer 221 having a primary winding and a secondary winding, a switch 222 for controlling a communication path between the transmitter block (TX) and the antenna 224, a switch 223 for controlling a communication path between the antenna 224 and the receiver block (RX), a power amplifier (PA) 225, and a low noise amplifier (LNA) 226. A first end of a secondary winding of the transformer 221 may be connected to single pole port, which is connected to an antenna 224. A second end of the secondary winding may be connected to the switches 222 and 223. The other end of the switch 222 may be connected to ground, and the other end of the switch 223 may be connected to a double throw port, which is connected an input of the LNA 226. An end of the primary winding of the transformer 221 may be connected to another double throw port, which is connected to an output of the PA 225. The transformer 221 may be used as an output network for the PA 225 of the TX. The secondary winding of the transformer 221 may be used as an input network (e.g., a matching network) for the LNA 226 of the RX. The PA 225 may operate during TX mode while the LNA 226 may operate during RX mode. One of two switches is closed for each mode. For example, switch 222 may be closed and switch 223 may be opened for TX mode. On the other hand, switch 222 may be opened and switch 223 may be closed for RX mode.

Figure 3:
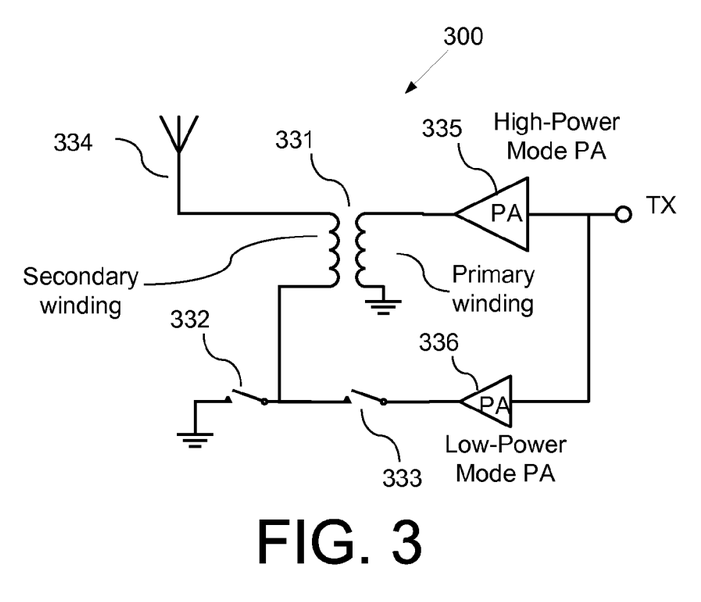
FIG. 3 illustrates a system for an example SPDT switch with a transformer, an antenna, a high-power mode power amplifier (PA), and a low-power mode power amplifier (PA), according to an example embodiment of the invention.

FIG. 3 illustrates a system 300 for an example SPDT switch with a transformer, an antenna, a high-power mode power amplifier (PA), and a low-power mode power amplifier (PA), according to an example embodiment of the invention. As shown in FIG. 3, the system may include a transformer 331 having a primary winding and a secondary winding, an antenna 334, a high-power mode power amplifier (PA) 335, and a low-power mode power amplifier (PA) 336, a switch 332 for controlling a communication path between the high-power mode PA 335 and the antenna 334, and a switch 333 for controlling a communication path between the low-power mode PA 336 and the antenna 334.

An end of the secondary winding of the transformer 331 may be connected to a single pole port, which is connected to the antenna 334. A second end of the secondary winding of the transformer 331 may be connected to switches 332 and 333. The other end of the switch 332 may be connected to ground, and the other end of the switch 333 may be connected to a double throw port, which is connected to the output of the low-power mode PA 336. An end of a primary winding of the transformer 331 may be connected to another double throw port, which is connected to an output of the high-power mode PA 335. The transformer 331 may be used as an output network for the high-power mode PA 335. The secondary winding of the transformer 331 may be used as an output network for the low-power mode PA 336. The high power mode PA 335 operates during a high-power mode for TX. The low-power mode PA 336 operates during a low-power mode for TX. One of two switches is closed for each mode. For example, switch 332 may be closed and switch 333 may be open during a high-power mode in which high-power mode PA 335 is operating. On the other hand, switch 332 may be open and switch 333 may be closed during a low-power mode in which low-power PA 336 is operating.

Figure 4:
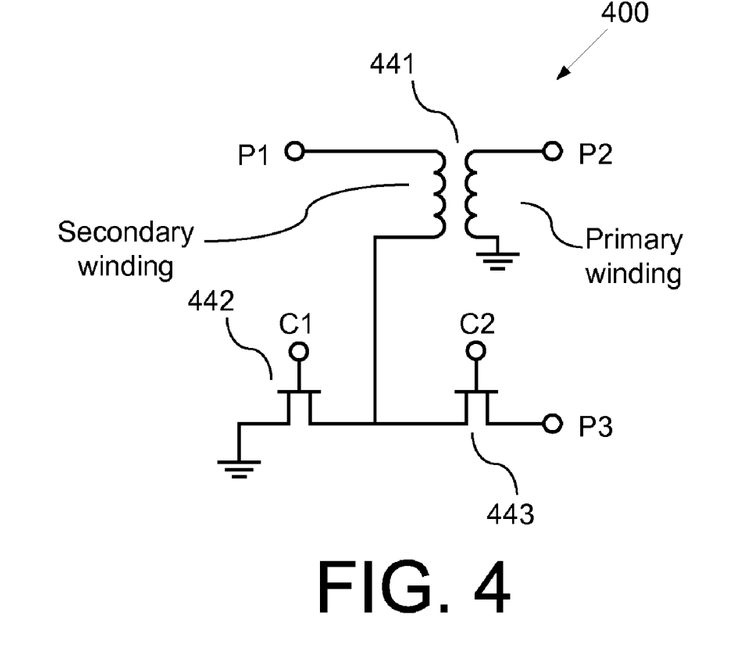
FIG. 4 illustrates a system for SPDT switch with a transformer, where transistors may be utilized for switches, according to an example embodiment of the invention.

FIG. 4 illustrates a system 400 for SPDT switch with a transformer, where transistors may be utilized for switches, according to an example embodiment of the invention. As shown in FIG. 4, the system 400 may include a transformer 441 having a primary winding and a secondary winding. An end of the secondary winding may be connected to a single pole port P1 while another end of the secondary winding may be connected to an end of transistor switches 442, 443. The other end of transistor switch 442 may be connected to ground, and the other end of transistor switch 443 may be connected to a double throw port P3. An end of the primary winding may be connected to a double throw port P2 while the other end of the primary winding may be connected to ground.

Still referring to FIG. 4, the transistor switch 442 may control the P2-to-P1 communications path, and the transistor switch 443 may control the P1-to P3 communications path. It will be appreciated that port P1 may be connected to an antenna, port P2 may be connected to an output of the transmitter block (TX), and port P3 may be connected to an input of a receiver block (RX), according to an example embodiment of the invention. The transformer 441 may be used as an output network for a power amplifier of the TX. The secondary winding of the transformer 441 may be used as an input network (e.g., a matching network) for an LNA of the RX.

The transistor switches 442, 443 may be implemented using FETs (Field Effect Transistors), including MOSFETs (Metal Oxide Semiconductor Field Effect Transistors), MESFETs (Metal Semiconductor Field Effect Transistors), and HEMTs (High Electron Mobility Transistors). The transistor switches 442, 443 may be controlled through their respective gates, C1 and C2. It will be appreciated that the transistor switches 442, 443 may be implemented using a semiconductor process, according to an example embodiment of the invention. Likewise, the transformer 441 also may be implemented with metal lines on semiconductor process. Thus, the system 400 may be integrated on a chip using a semiconductor process, according to an example embodiment of the invention.

Figure 5:
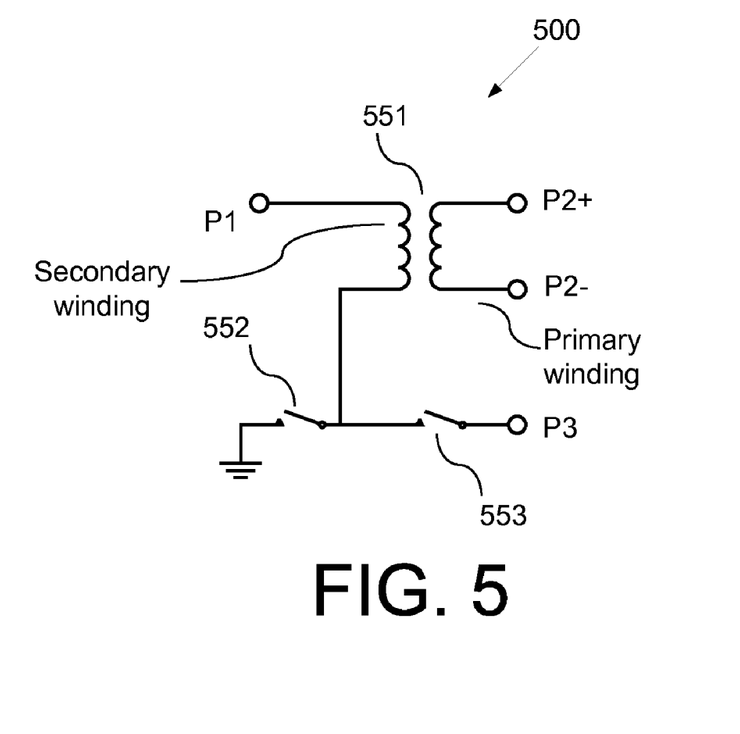
FIG. 5 illustrates a system for an example SPDT switch with a transformer, where at least one port is differential, according to an example embodiment of the invention.

FIG. 5 illustrates a system 500 for an example SPDT switch with a transformer, where at least one port is differential, according to an example embodiment of the invention. As shown in FIG. 5, the system 500 may include a transformer 551 having a primary winding and a secondary winding. An end of the secondary winding may be connected to a single pole port P1 while another end of the secondary winding may be connected to an end of switches 552 and 553. Port P1 may be connected to an antenna. The other end of the switch 552 may be connected to ground, and the other end of the switch 553 may be connected to a double throw port P3, which may be connected to an input of the receiver block (RX). The ends of the primary winding may collectively form another double throw port P2, which may be comprised of ±differential ports P2+ and P2−. Differential ports P2+ and P2− may be connected to an output of the transmitter block (TX). The transformer 551 may be used as an output network for a differential power amplifier of the TX. The secondary winding of the transformer 551 may be used as an input network for an LNA of the RX. The switch 552 may control the P2-to-P1 communications path, and the switch 553 may control the P3-to-P1 communications path.

Figure 6A:
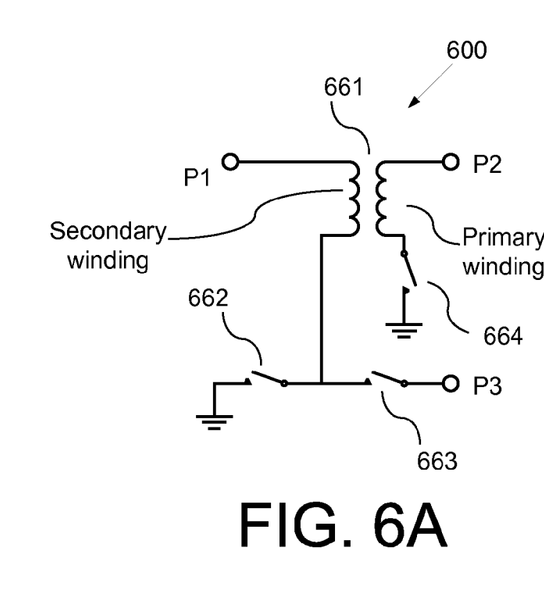
FIG. 6A illustrates a system for an SPDT switch with a transformer, according to an example embodiment of the invention.

FIG. 6A illustrates a system 600 for an SPDT switch with a transformer, according to an example embodiment of the invention. As shown in FIG. 6A, the system 600 may include a transformer 661 having a primary winding and a secondary winding. An end of the secondary winding may be connected to a single pole port P1 while another end of the secondary winding may be connected to an end of switches 662 and 663. The other end of the switch 662 may be connected to ground, and the other end of the switch 663 may be connected to a double throw port P3. An end of the primary winding may be connected to a double throw port P2 while the other end of the primary winding may be connected to an end of a switch 664. The other end of the switch may be connected to ground.

Still referring to FIG. 6A, the two switches 662, 664 may control the P2-to-P1 communication path, and the switch 663 may control the P1-to-P3 communication path. It will be appreciated that port P1 may be connected to an antenna, port P2 may be connected to an output of a transmitter block (TX), and port P3 may be connected to an input of a receiver block (RX), according to an example embodiment of the invention. The transformer 661 may be used as an output network for a power amplifier of the TX. The secondary winding of the transformer 661 may be used as an input network for an LNA of the RX.

Figure 6B:
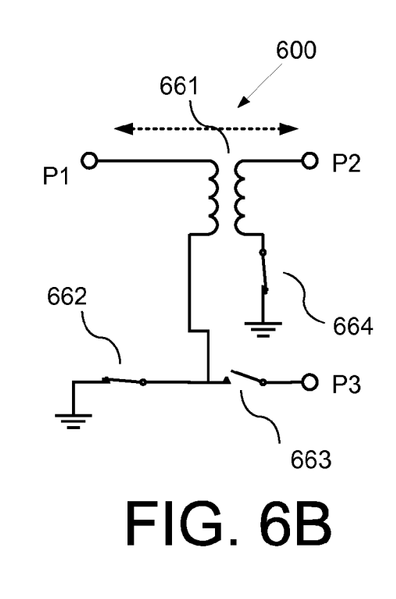
FIG. 6B illustrates the system for an example SPDT switch with a transformer when the P1-to-P2 communications path is ON, according to an example embodiment of the invention.

FIG. 6B illustrates the system 600 for an example SPDT switch with a transformer when the P1-to-P2 communications path is ON, according to an example embodiment of the invention. The P1-to-P2 communications path may be ON when a transmitter block (TX) connected to port P2 is enabled, according to an example embodiment of the invention. As shown in FIG. 6B, the system 100 may close the switches 664 and 662 to enable the P1-to-P2 communications path, and open the switch 663 to disable the P1-to-P3 communications path. As the switch 663 is opened, port P3 is isolated from port P1. The transformer 661 transfers signals between port P1 and port P2 when the switches 662, 664 are closed, according to an example embodiment of the invention.

Figure 6C:
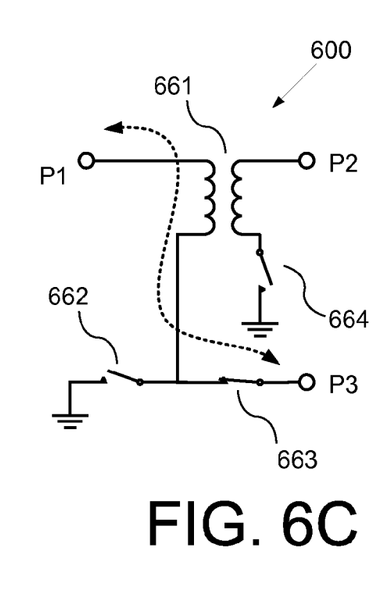
FIG. 6C illustrates a system for an example SPDT switch with a transformer when the P1-to-P3 communications path is ON, according to an example embodiment of the invention.

FIG. 6C illustrates a system 600 for an example SPDT switch with a transformer when the P1-to-P3 communications path is ON, according to an example embodiment of the invention. The P1-to-P3 communications path may be ON when a receive block (RX) is enabled, according to an example embodiment of the invention. As shown in FIG. 6C, the system 600 may open the switches 662, 664 to disable the P2-to-P1 path, and close the switch 663 to enable the P1-to-P3 path. As the switches 662, 664 are opened, the transformer 611 cannot transfer the signal between ports P1 and P2 due to the high impedance instead of ground at the secondary winding, and thus port P2 is isolated from port P1. The transformer 611 transfers signals between ports P1 and P3 with the switch 663 is closed, according to an example embodiment of the invention.

Figure 7:
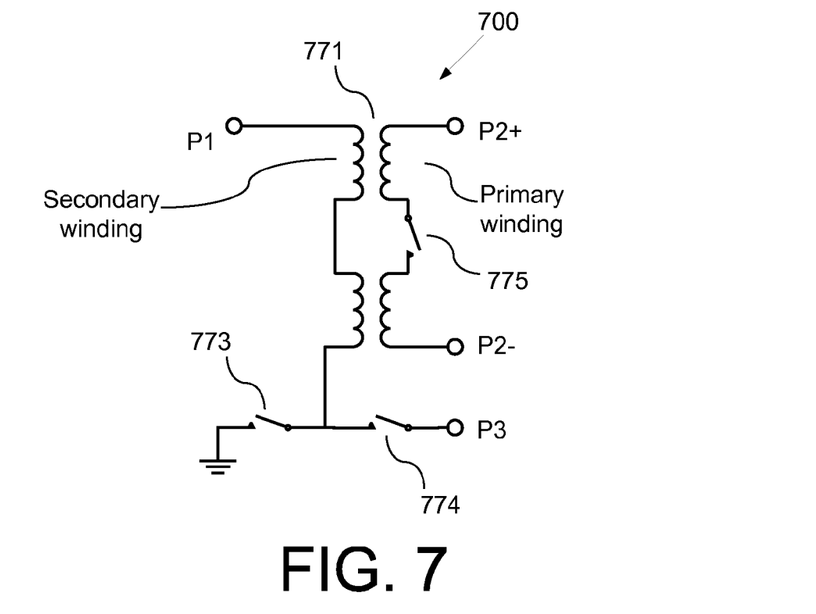
FIG. 7 illustrates a system 700 for an example SPDT switch with a transformer, where at least one port is differential, according to an example embodiment of the invention.

FIG. 7 illustrates a system 700 for an example SPDT switch with a transformer, where at least one port is differential, according to an example embodiment of the invention. As shown in FIG. 7, the system 700 may include a transformer 771 having a primary winding and a secondary winding. An end of the secondary winding may be connected to a single pole port P1 while another end of the secondary winding may be connected to an end of switches 773 and 774. Port P1 may be connected to an antenna. The other end of the switch 773 may be connected to ground, and the other end of switch 774 may be connected to a double throw port P3, which may be connected to an input of the receiver block (RX). The ends of the primary winding may collectively form another double throw port P2, which may be comprised of ±differential ports P2+ and P2−. Differential ports P2+ and P2− may be connected to an output of the transmitter block (TX).

Still referring to FIG. 7, the two switches 773, 775 may control the P2-to-P1 communications path, and the switch 774 may control the P3-to-P1 communications path. The switch 775 may be inserted in series at the center point of the primary winding of the transformer 771. As shown in FIG. 7, the primary winding may include a first segment and a second segment, where the first segment is connected to an end of the switch 775 and the differential port P2+, and the second segment is connected to another end of the switch 775 and the differential port P2−. The center point of the primary winding, which may be between the first and second segments, is at a virtual ground and the voltage swing is negligible. Therefore, the switch 775 may not suffer from a high voltage swing. Likewise, it will be appreciated that the secondary winding may likewise be comprised of a first segment and the second segment, where the first segment are connected by a straight section, where the straight section is adjacent to the switch 775. The transformer 771 may be used as an output network for a differential power amplifier of the TX. The secondary winding of the transformer may be used as an input network (e.g., matching network) for an LNA of the RX.

It will be appreciated that variations of FIG. 7 are available without departing from example embodiments of the invention. According to an example embodiment, the first and second segments of primary winding may otherwise be associated with respective primary windings of first and second transformers without departing from example embodiments of the invention. Similarly, the first and second segments of the secondary winding may likewise be associated with respective secondary windings of first and second transformers without departing from example embodiments of the invention.

Figure 8:
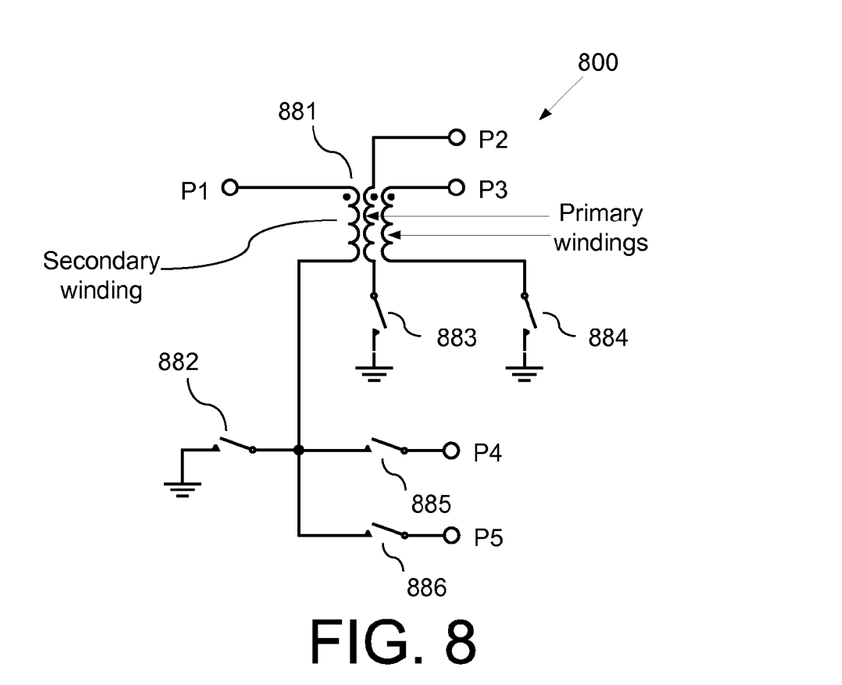
FIG. 8 illustrates a system for an example SPMT (Single Pole Multi-Throw) switch with a transformer in accordance with an example embodiment of the invention.

FIG. 8 illustrates a system 800 for an example SPMT (Single Pole Multi-Throw) switch with a transformer in accordance with an example embodiment of the invention. As shown in FIG. 8, the system may include a multi-primary winding transformer 881 having at least two primary windings and a secondary winding; a switch 882 at the secondary winding of the transformer for use in controlling the P2-to-P1 communications path and the P3-to-P1 communications path; a switch 883 at the first primary winding for using in controlling the P2-to-P1 communications path; a switch 884 at the second primary winding for use in controlling the P3-to-P1 communications path; a switch 885 for controlling the P1-to-P4 communications path; and a switch 886 for controlling the P1-to-P5 communications path.

Single pole Port P1 may be connected to an antenna. A multi-throw port P2 may be connected to a first output of a transmitter block (TX). Multi-throw port P3 may be connected to a second output of another transmitter block (TX). It will be appreciated that the first and second outputs of the TXs may differ based upon applications (e.g., different modulation schemes or signal types) or frequency bands, according to an example embodiment of the invention. Multi-throw port P4 may be connected to a first input of a receiver block (RX). Multi-throw port P5 may be connected to a second input of another receiver block (RX). It will be appreciated that the first and second inputs of the RXs may differ based upon applications (e.g., different modulation schemes or signal types) or frequency bands, according to an example embodiment of the invention. Each primary winding of the multi-primary winding transformer 881 may be used as an output network for a respective power amplifier of each TX. The secondary winding of the transformer 881 may be used as an input network for an LNA of the RXs.

Figure 9:
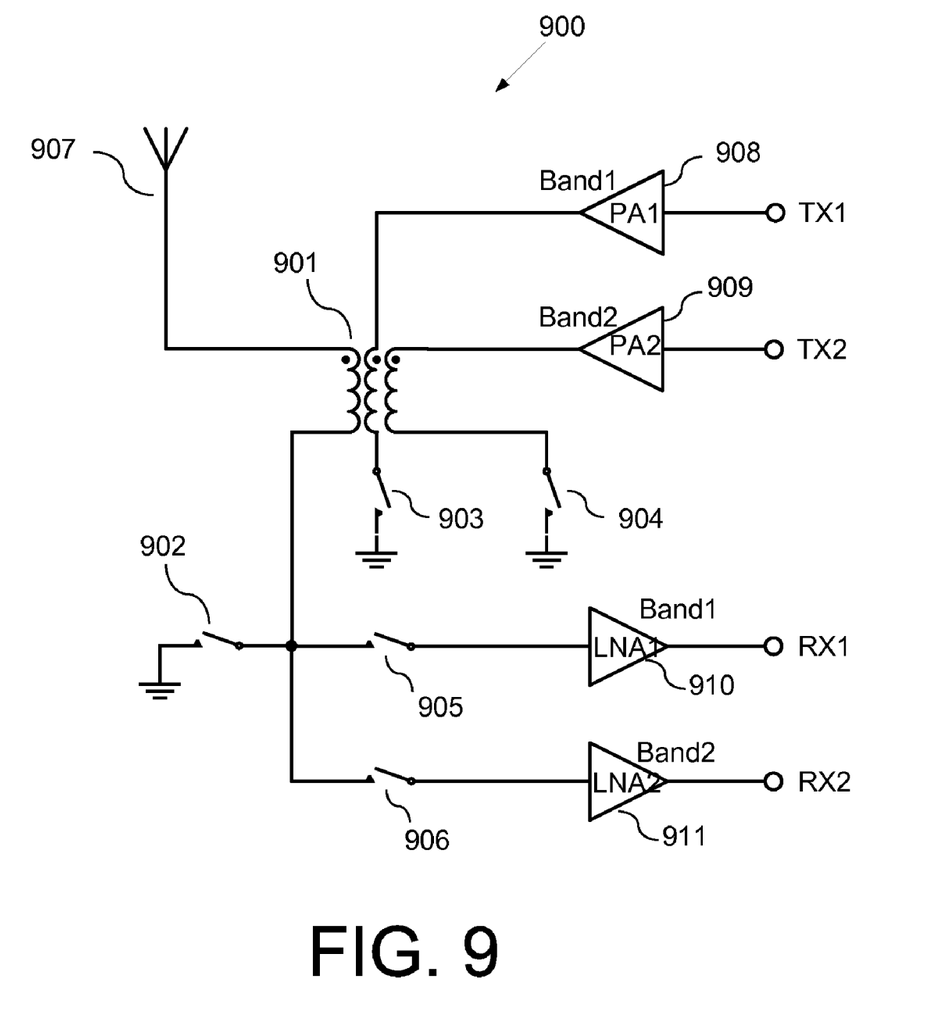
FIG. 9 illustrates a system for an example SPMT (Single Pole Multi-Throw) switch with a transformer, an antenna, multi-band PAs, and multi-band LNAs, according to an example embodiment of the invention.

FIG. 9 illustrates a system 900 for an example SPMT (Single Pole Multi-Throw) switch with a transformer, an antenna, multi-band PAs, and multi-band LNAs, according to an example embodiment of the invention. As shown in FIG. 9, the system 900 may include a multi-primary winding transformer 901, a first power amplifier (PA1) 908 for a first frequency band, a second power amplifier (PA2) 909 for a second frequency band, a first low noise amplifier (LNA1) 910 for a first frequency band, and a second low noise amplifier (LNA2) 911 for a second frequency band. The system 900 may also include a switch 902 at the secondary winding of the transformer 901 for controlling communications from TX1 and TX2 to the antenna 907, a switch 903 at the first primary winding for controlling communications from TX1 to the antenna 907, a switch 904 at the second primary winding for controlling communications from TX2 to the antenna 903, a switch 905 for controlling communications from the antenna 907 to RX1, and a switch 906 for controlling communications form the antenna 907 to RX2.

Still referring to FIG. 9, an end of a secondary winding of the transformer 901 may be connected a single pole port, which may be connected to an antenna 907. The other end of the secondary winding of the transformer may be connected to the switch 902, the switch 905, and the switch 906. The other end of the switch 902 may be connected to ground. The other end of the switch 905 may be connected to a multi-throw port, which may be connected to the LNA1 910. The other side of the switch 906 may be connected to another multi-throw port, which may be connected to the LNA2 911. An end of the first primary winding of the transformer may be connected to a multi-throw port, which may be connected to the PA1 908 while the other end of the first primary winding may be connected to the switch 903. The other end of the switch 903 may be connected to ground. An end of the second primary winding of the transformer may be connected to another multi-throw port, which may be connected to the PA2 909. Another end of the second primary winding may be connected to switch 904. The other end of the switch 904 may be connected to ground. It will be appreciated that each primary winding of the multi-primary winding transformer 901 may be used as an output network for the power amplifier of each band TX. The secondary winding of the transformer 901 may be used as an input network for the LNA of each band RX.

According to an example embodiment of the invention, for TX1 to transmit a signal via the antenna 907, switches 902 and 903 may be closed while switches 904, 905, and 906 may be open. Likewise, for TX2 to transmit a signal via the antenna 907, switches 902 and 904 may be closed while switches 903, 905, and 906 may be open. On the other hand, for RX1 to receive a signal via the antenna 907, switch 905 may be closed while switches 903, 904, 902, and 906 may be opened. Likewise, for RX2 to receive a signal via the antenna 907, switch 906 may be closed whiled switches 903, 904, 902, and 905 may be opened.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A SPDT (single pole double throw) or SPMT (single pole multi-throw) switch system, comprising:
a transformer having a primary winding and a secondary winding, wherein the primary winding and the secondary winding each have respective first and second ends, wherein the first end of the secondary winding is connected to a single pole port, wherein the first end of the primary winding is connected to a first throw port;
a first switch having a first end and a second end, wherein the first end is connected to ground; and
a second switch having a first end and a second end, wherein the second end of the secondary winding is connected to both the second end of the first switch and the first end of the second switch, wherein the second end of the second switch is connected to a second throw port,
wherein the first switch controls, at least in part, a first communication path between the single pole port and the first throw port, and
wherein the second switch controls, at least in part, a second communication path between the second throw port and the single pole port.

2. The system of claim 1, wherein the single pole port is connected to an antenna, and wherein the first and second throw ports are connected to one or more transmitter block outputs or receiver block inputs.

3. The system of claim 2, wherein the first throw port is connected to an output of power amplifier of a transmitter block and the second throw port is connected to an input of a low noise amplifier of a receiver block.

4. The system of claim 2, wherein the first throw port is connected to a first output of a high-power mode power amplifier of a transmitter block, and wherein the second throw port is connected to a second output of a low-power mode power amplifier of the transmitter block.

5. The system of claim 1, wherein the second end of the primary winding is connected to ground.

6. The system of claim 1, further comprising:
a third switch having a first end and a second end, wherein the first end of the third switch is connected to a second end of the primary winding, and wherein the second end of the third switch is connected to ground,
wherein the third switch and the first switch control, at least in part, the first communication path between the single pole port and the first throw port.

7. The system of claim 1, wherein the first and second switches are transistors, wherein each transistor is one of (i) a Field Effect Transistor (FET), (ii) a Metal Oxide Semiconductor Field Effect Transistor (MOSFET), (iii) a Metal Semiconductor Field Effect Transistor (MESFET) or (iv) a High Electron Mobility Transistor (HEMT).

8. The system of claim 7, wherein the transformer is fabricated with metal lines using a semiconductor process, wherein the transformer and the first and second switches are provided in a single semiconductor chip.

9. The system of claim 1, wherein the secondary winding of the transformer is utilized for a matching network for components connected to the second throw port.

10. The system of claim 1, further comprising:
a third switch having a first end and a second end, wherein the transformer further includes a second primary winding having a first end and a second end, wherein the first end of the second primary winding is connected to a third throw port, wherein the second end of the second primary winding is connected to the first end of the third switch, wherein the second end of the third switch is connected to ground, and
wherein the third switch and the first switch control, at least in part, a third communication path between the single pole port and the third throw port.

11. The system of claim 10, further comprising:
a fourth switch having a first end and a second end, wherein the first end of the fourth switch is connected to the second end of the secondary winding, the second end of the first switch, and the first end of the second switch, wherein the second end of the fourth switch is connected to a fourth throw port,
wherein the fourth switch controls, at least in part, a fourth communication path between the fourth throw port and the single pole port.

12. The system of claim 11, wherein the single pole port is connected to an antenna, wherein the first and second throw ports are connected to respective first and second transmitter block output, and wherein the third and fourth throw ports are connected to respective third and fourth receiver block inputs.

13. The system of claim 1,
wherein during a transmit mode, the first switch is closed to enable the first communication path between the single pole port and the first throw port, and the second switch is opened to disable the second communication path between the second throw port and the single pole port, and
wherein during a receive mode, the first switch is opened to disable the first communication path between the single pole port and the first throw port, and the second switch is closed to enable the second communication path between the second throw port and the single pole port.

14. A SPDT (single pole double throw) or SPMT (single pole multi-throw) switch system, comprising:
a transformer having a primary winding and a secondary winding, wherein the primary winding and the secondary winding each have respective first and second ends, wherein the first end of the secondary winding is connected to a single pole port, wherein the first end of the primary winding is connected to a first differential port, wherein the second end of the primary winding is connected to a second differential port, wherein the first and second differential ports collectively form a first throw port;

a first switch having a first end and a second end, wherein the first end is connected to ground; and a second switch having a first end and a second end, wherein the second end of the secondary winding is connected to both the second end of the first switch and the first end of the second switch, wherein the second end of the second switch is connected to a second throw port, wherein the first switch controls, at least in part, a first communication path between the single pole port and the first throw port, and wherein the second switch controls, at least in part, a second communication path between the second throw port and the single pole port.

15. The system of claim 14, wherein the primary winding comprises a first segment and a second segment, wherein the first and second segments have respective first and second ends, wherein the first end of the first segment is connected to the first differential port, wherein the second end of the second segment is connected to the second differential port, and further comprising:

a third switch having a first end and a second end, wherein the first end of the third switch is connected to the second end of the first segment, and wherein the second end of the third switch is connected to first end of the second segment, wherein the first switch and the third switch control, at least in part, the first communication path between the single pole port and the first throw port.

16. The system of claim 15, wherein a center point between the first and second segments of the primary winding is at a virtual ground, wherein the virtual ground is provided to the third switch.

17. The system of claim 14, wherein the single pole port is connected to an antenna, wherein the first and second differential ports are connected to outputs of a differential power amplifier of a transmitter block, and wherein the second throw port is connected to a input of a low noise amplifier.

18. The system of claim 14, wherein the first and second switches are transistors fabricated using a semiconductor process, wherein the transformer is fabricated with metal lines using the semiconductor process, wherein the first and second switches and the transformer are provided within a single semiconductor chip.

19. The system of claim 14, wherein the first and second switches each comprise one of: (i) a Field Effect Transistor (FET), (ii) a Metal Oxide Semiconductor Field Effect Transistor (MOSFET), (iii) a Metal Semiconductor Field Effect Transistor (MESFET) or (iv) a High Electron Mobility Transistor (HEMT).

20. The system of claim 14, wherein during a transmit mode, the first switch is closed to enable the first communication path between the single pole port and the first throw port, and the second switch is opened to disable the second communication path between the second throw port and the single pole port, and wherein during a receive mode, the first switch is opened to disable the first communication path between the single pole port and the first throw port, and the second switch is closed to enable the second communication path between the second throw port and the single pole port.

* * * * *